United States Patent [19]
Bowers et al.

[11] Patent Number: 5,736,899
[45] Date of Patent: Apr. 7, 1998

[54] FULLY DIFFERENTIAL VOLTAGE CONTROLLED OPERATIONAL TRANSCONDUCTANCE AMPLIFIER

[76] Inventors: Derek F. Bowers, 1502 Harrison Ct., Sunnyvale, Calif. 94087; James K. Waller, Jr., 174 Morgan Hill, Orion, Mich. 48360

[21] Appl. No.: 647,543

[22] Filed: May 15, 1996

[51] Int. Cl.⁶ ........................................... H03F 3/45
[52] U.S. Cl. ................................. 330/252; 330/258
[58] Field of Search ............................ 330/252, 258, 330/259, 261, 303, 306

[56] References Cited

U.S. PATENT DOCUMENTS

| 3,786,362 | 1/1974 | Marsh et al. | 330/258 |
| 5,436,594 | 7/1995 | Pace et al. | 330/258 |

FOREIGN PATENT DOCUMENTS

| 0168410 | 12/1981 | Japan | 330/258 |

OTHER PUBLICATIONS

"LM13600/CL13600A Dual Operational Transconductance Amplifiers with Linearizing Diodes and Buffers", *National Semiconductor Linear Design Databook 1*, No. 400041, Rev. 1, National Semiconductor Corporation, Santa Clara, California, pp. 2–516 and 2–533.

*Primary Examiner*—Steven Mottola
*Attorney, Agent, or Firm*—Koppel & Jacobs

[57] ABSTRACT

A differential input/differential output OTA includes two resistively degenerated matched pairs of bipolar transistors; one pair provides differential input, the other provides differential output and feedback to the first pair, thus canceling AC distortions. In voltage controlled filter applications that employ the new OTA, control feedthrough is significantly reduced when compared to similar low pass filters which employ conventional OTAs.

10 Claims, 3 Drawing Sheets

FULLY DIFFERENTIAL VOLTAGE CONTROLLED OPERATIONAL TRANSCONDUCTANCE AMPLIFIER

BACKGROUND OF THE INVENTION

1. Field of the Invention

The invention is related to operational transconductance amplifiers and, in particular, to voltage-controlled operational transconductance amplifiers.

2. Description of the Related Art

Voltage controlled operational transconductance amplifiers (OTAs) are known. The LM13600, available from National Semiconductor, Santa Clara, Calif. is one example of a monolithic integrated circuit voltage controlled OTA. Generally, the control terminal of such an amplifier is connected to manipulate the bias current supplied to a matched differential pair of bi-polar transistors which compose the amplifier's input stage. By controlling the bias current, the transconductance gm of the pair can be varied, thus varying a parameter of circuits which employ the amplifier. Voltage controlled OTAs are sometimes employe to vary the cutoff frequency of a filter, for example.

The block diagram of FIG. 1 illustrates, at a broad level, a filter which employs an OTA. A signal that is to be filtered, VIN, is connected to the input of an OTA 6 which also provides a voltage control input labeled VCON. A portion of the output signal VOUT is fed back to the OTA through a feedback network 8 which, generally, is composed of a combination of resistors and capacitors. The capacitors, resistors, and the transconductance of the OTA combine to determine the filter's characteristics, such as cutoff frequency. Such filters may be low-pass, high-pass or band-pass filters.

Voltage controlled filters, because their cutoff frequency may be readily adjusted through manipulation of a control input, are particularly suited to applications which require some level of interactivity. For example, in audio applications a controller such as a microprocessor may monitor the level of noise at various frequencies within an audio signal and, in response to noise-level variations at different frequencies, adjust the cutoff frequencies of filters to reduce the signal's noise content. This filtering may take place during the recording process, during playback, or both.

One example of a conventional voltage controlled low-pass filter 10 is illustrated in FIG. 2. The filter, essentially, uses an OTA 12 which is typically packaged with a high gain buffer output stage 14 such as the darlington pair illustrated. The filter's output, labeled VOUT, appears at a terminal having the same label. The output is fed back through an attenuation circuit including resistors R and RA which form a voltage divider between the filter's output VOUT and a negative supply voltage V−. This voltage V− is generally the most negative voltage within the circuit and may be connected to "ground" or to a voltage more negative than ground, depending upon the application. The divider's tap is connected to the inverting input of the amplifier 12, thereby providing negative feedback for the filter. An input signal VIN is applied to the noninverting input of the amplifier 12 and a control signal VCON, which controls the cutoff frequency of the filter 10, is connected to a control input having the same label.

The control signal VCON determines the amount of bias current supplied by a current source 16 to the amplifier 12. The current source, in fact, is typically a part of the amplifier 12, but is illustrated as a separate component in FIG. 2 for the sake of clarity. A capacitor C1 is connected across the output of the amplifier 12 and the negative supply terminal V−. The cutoff frequency of the filter 19 is given by the expression:

$$Fo = (RA)(gm)/(R+RA)(2\pi C1)$$

where:

RA=the resistance of the resistor RA
R=the resistance of the resistor R
gm=the transconductance of the input stage of the amplifier 12
C1=the capacitance of the capacitor C1
Fo=the cutoff frequency The transconductance gm of the amplifier 12 is a function of the input stage collector current Ic which is approximately equal to the input stage bias current:

$$gm = (q)(Ic)/(k)(T)$$

where:

q=the electron charge
k=Boltzmann's constant
T=temperature Kelvin
Ic=input stage collector current Therefore, one may adjust the cutoff frequency of the filter by employing the control input VCON to adjust the bias current 16.

Control feedthrough presents a significant problem with filters such as the one illustrated in FIG. 2. That is, the transistors which comprise the amplifier input stage, current mirrors, etc., are not perfectly matched and, due to the mis-matching, create an undesirable offset output current. Although this offset could be dealt with in a fairly straight-forward manner otherwise, since the amplifier bias current is varied to alter the amplifier's transconductance, the offset also varies with the control input. To correctly balance a single-ended output circuit such as this would require that the device characteristics of constituent PNP and NPN transistors be precisely matched: an impractical if not impossible task. Furthermore, the output buffer 14 requires base current which will also vary as a function of bias current. These variations, i.e., in the offset current due to component mismatch, and in the buffer base current requirements, create unwanted signals at the output of the buffer 14 which, in audio applications appear as audible "clicks". Obviously, adding noise to the signal is in complete opposition to the goal of the filter.

Although various schemes may be employed to counter-act the effects of feedthrough once it is generated in the above fashion, these approaches tend to require a significant investment in circuitry which, in turn, increases the cost and reduces the reliability of circuitry which employs the filter.

SUMMARY OF THE INVENTION

The invention is directed to a simple, reliable, inexpensive, operational transconductance amplifier having both a differential input and a differential output, that substantially reduces control feedthrough.

The invention includes a matched pair of bipolar transistors the bases of which form a differential amplifier input port. One set of the pair's current conducting terminals are coupled through degeneration resistors to a first current source, the other through active loads to a bias voltage terminal. A second matched pair of bipolar transistors has its corresponding current conducting terminals connected to the current conducting terminals of the first pair that are coupled to active loads. The other current conducting terminals of the second pair are coupled through degeneration resistors to a second current source of equal value to the first current source. The bases of the second matched pair form the terminals of a differential output port for the OTA. Differential feedback between the matched pairs significantly reduces AC signal distortions. In the preferred embodiment, the matched pairs are NPN transistors and their emitters are coupled through degeneration resistors to equal current sources and their collectors are coupled through active loads to a bias voltage.

The differential output terminals are coupled to a common mode feedback circuit. A current steering circuit provides a voltage control input which controls the amount of current flowing into the differential pairs, thereby controlling the transconductance of the amplifier.

A noise reduction circuit, which interposes diodes between a bias voltage terminal and the active loads, may be added to the amplifier.

The new amplifier may be employed to create a voltage controlled low pass filter by placing a capacitor across high impedance nodes created at junctions between the active load and current steering circuits.

These and other features, aspects and advantages of the invention will be apparent to those skilled in the art from the following detailed description, taken together with the accompanying drawings.

DETAILED DESCRIPTION OF THE INVENTION

Figure 1:
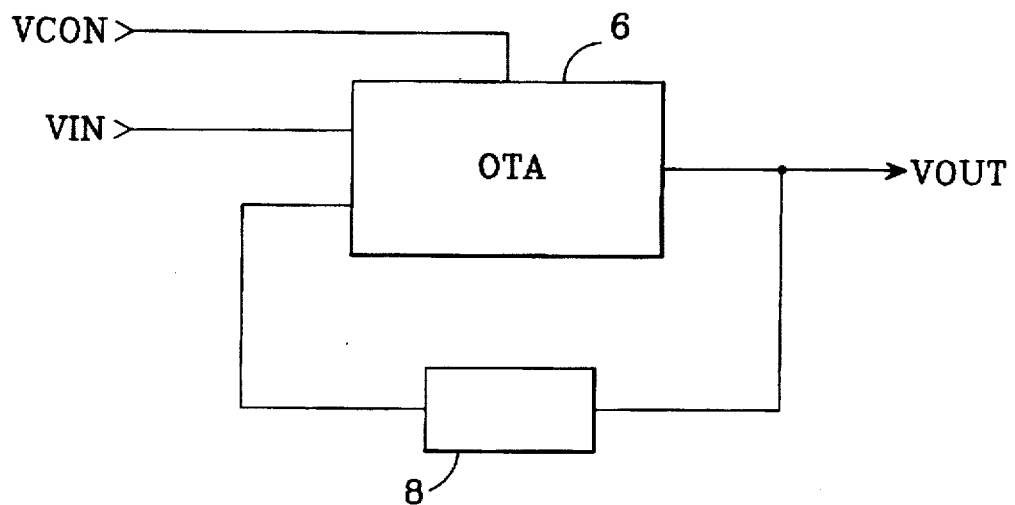
FIG. 1 is a block diagram of a filter which employs a conventional OTA.
Figure 2:
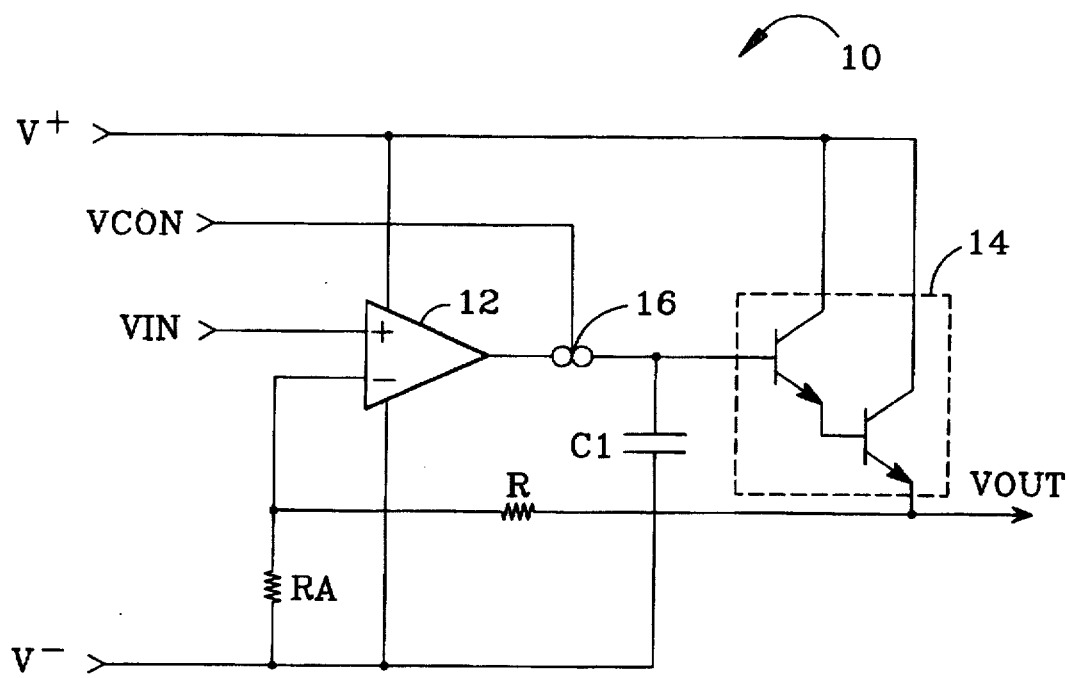
FIG. 2 is a schematic diagram of a low-pass filter which employs a conventional OTA.
Figure 3:
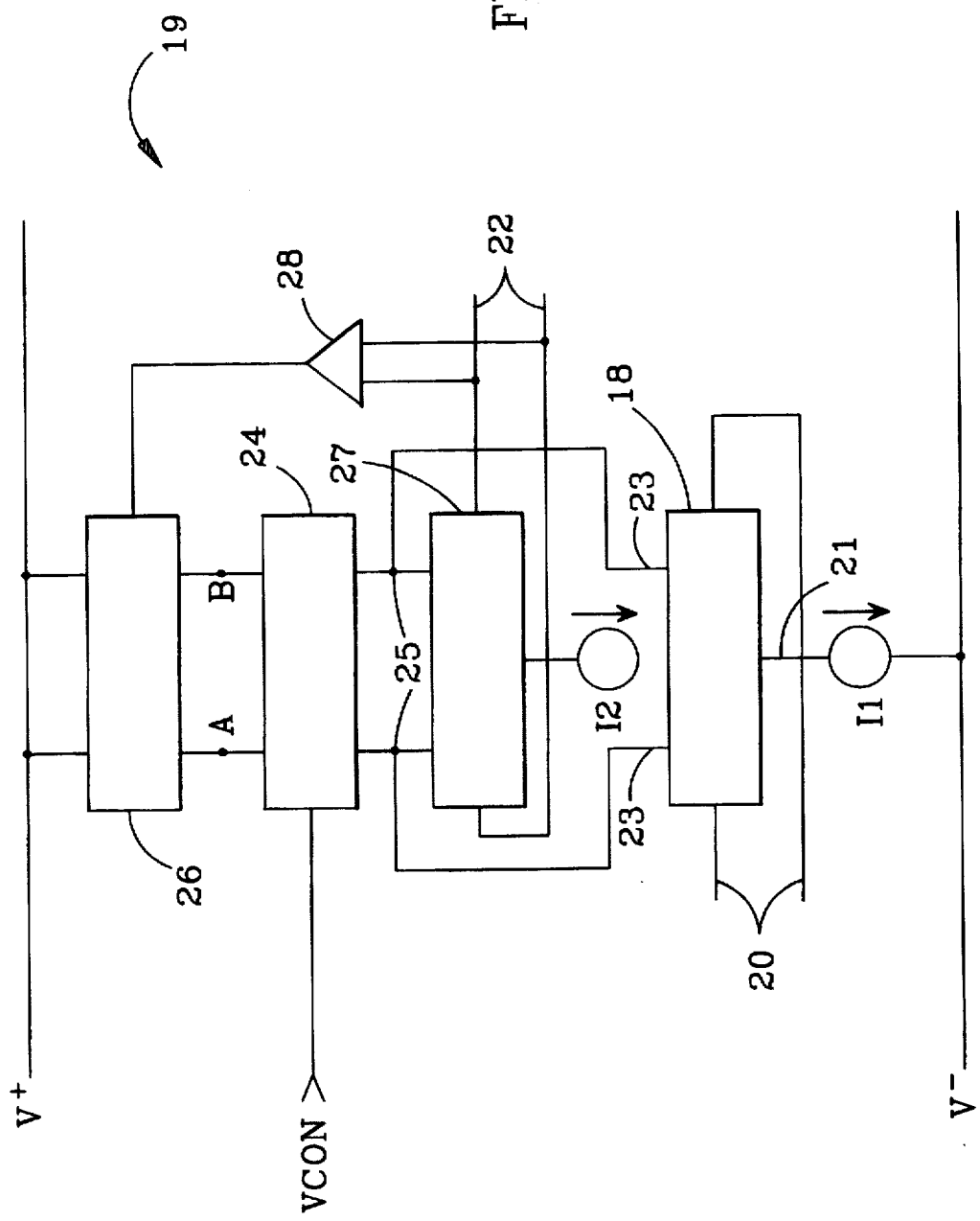
FIG. 3 is a block diagram of a new OTA.

The block diagram of FIG. 3 illustrates a preferred embodiment of a new OTA 19. A matched differential pair of bipolar transistors 18 forms a differential input stage with the bases of the transistors providing a differential input 20. As will be described in greater detail in relation to FIG. 4, a current source I1 sinks bias current from identical current conducting terminals 21, i.e., both collectors or both emitters, of the differential pair 18, and the transistors' remaining current conducting terminals 23 (collectors in the preferred embodiment) are connected to identical current conducting terminals 25 (collectors) of a second differential pair 27. The bases of the second differential pair 27 form a differential output port 22. A current source I2 sinks bias current from the differential pair 27. This connection, between the two pairs of collectors 23/25 in the preferred embodiment, provides differential feedback which, as will be discussed in greater detail in relation to FIG. 4, cancels AC distortion in the pairs 18,27.

The current conducting terminals 25 of the second differential pair are coupled through a current-steering circuit 24 to an active load 26 and, from there, to a positive voltage terminal V+. The current steering circuit 24 includes an input control terminal VCON which controls the amount of current flowing into the differential pairs 18,27, and thereby controls the transconductance of the amplifier 19. A common mode feedback circuit 28, in conjunction with the active load 26, yields differential high impedance points A and B which may be used, for example, to connect a capacitor in order to produce a voltage controlled filter.

Figure 4:
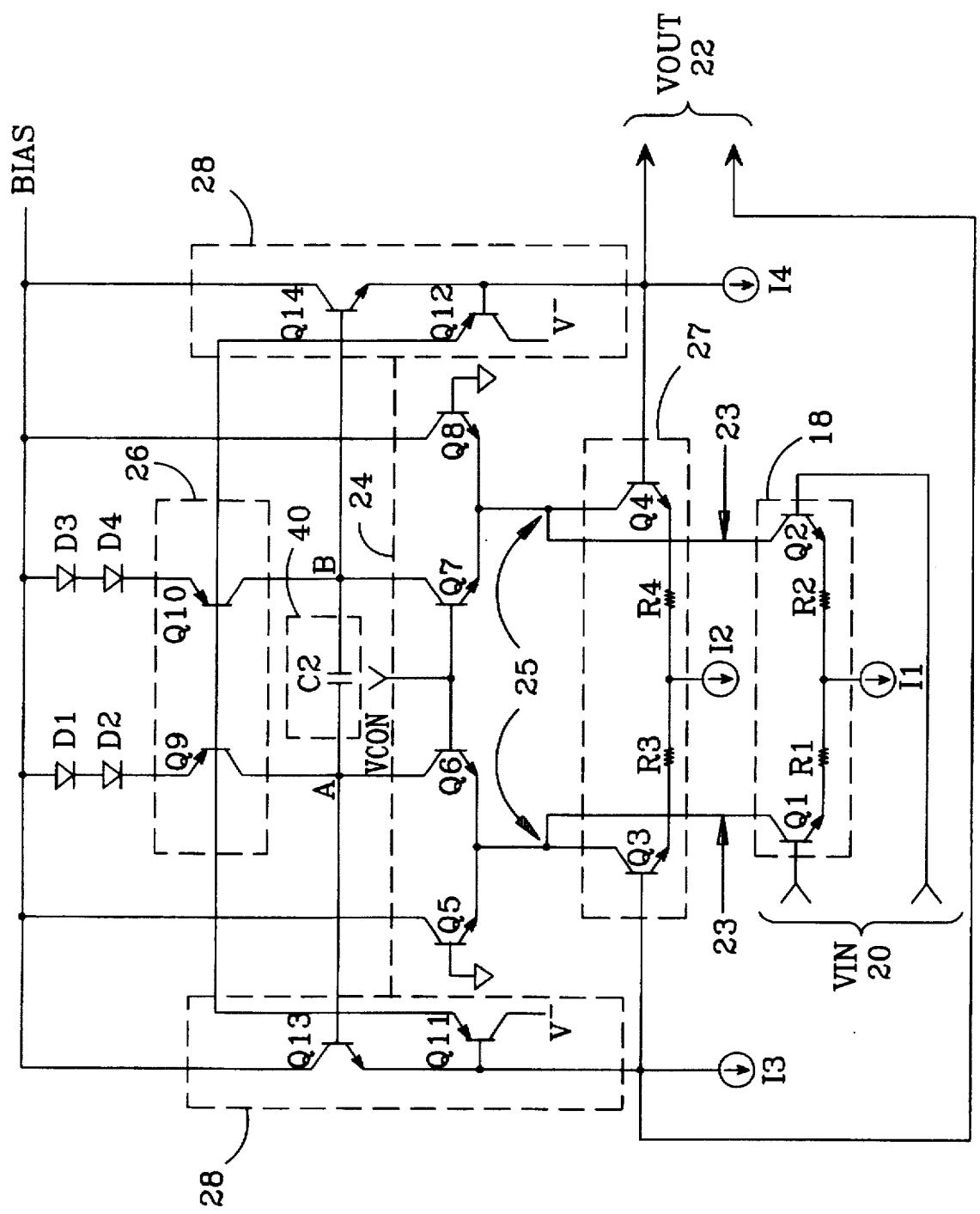
FIG. 4 is a schematic diagram of low pass filter which employs the new OTA of FIG. 3

The schematic diagram of FIG. 4 illustrates a preferred embodiment of a new voltage controlled low pass filter which employs the novel OTA. Base currents are neglected in the following discussion. In this exemplary embodiment, a differential pair 18 includes NPN transistors Q1 and Q2 coupled from their respective emitters through degeneration resistors R1 and R2, respectively, to a current source I1. Similarly, a differential pair 27 includes NPN transistors Q3 and Q4 connected through degeneration resistors R3 and R4, respectively, to a current source I2. Currents I1 and I2 are equal. The degeneration resistors R1-R4 increase the input range of the respective differential pairs 18,27 and reduce filter distortion. The collectors of the transistors Q1 and Q3 are connected together, as are the collectors of the transistors Q2 and Q4. This connection provides differential feedback which cancels AC distortion. Due to the new amplifier's fully differential design, in the case of a voltage controlled filter with zero input voltage, adjustment of the control voltage will have substantially no effect upon the filter's differential output.

In the preferred embodiment, the current steering circuit 24 includes two differential pairs of NPN transistors. One pair, consisting of transistors Q5 and Q6, is connected, at the constituent emitters, to the collectors of transistors Q3 and Q1. Similarly, the pair consisting of transistors Q7 and Q8 have their emitters connected to the collectors of the transistors Q2 and Q4. The transistors Q5 and Q8 have their respective collectors connected to a terminal BIAS which supplies a bias voltage to the amplifier and their bases are connected to another fixed voltage, "ground" in this example.

The bases of the matched transistors Q6 and Q7 are connected to one another and form the voltage control terminal VCON. The collectors of the transistors Q6 and Q7 are coupled through active load matched PNP transistors Q9 and Q10, respectively, to the BIAS terminal. An optional noise reduction circuit includes diode pairs D1,D2 and D3,D4 that are connected to couple current from the bias terminal BIAS to the load transistors Q9 and Q10, respectively. The diode pairs D1,D2 and D3,D4 produce equal forward voltage drops and the base-emitter voltages of the transistors Q9 and Q10 are equal, thus establishing equal currents through the matched pair Q9,Q10. Because they are matched transistors, their bases are shorted to one another, and their collectors are connected to the collectors of matched, equal-biased transistors Q9 and Q10, the transistors Q6 and Q7, respectively, also tend to carry equal currents.

In operation, the current steering circuit 24 routes some fraction of the fixed current supplied to the collectors of the transistors Q3,Q1 and Q2,Q4, through the transistors Q6 and Q7, respectively. With the control voltage VCON at a level which cuts off the transistors Q5 and Q8, substantially all the current from the load transistors Q9 and Q10 flows into the collectors of transistors Q1,Q3 and Q2,Q4, respectively. That is, the current through transistor Q6 equals the sum of currents through transistors Q1 and Q3 and the current through transistor Q7 equals the sum of currents through the transistors Q2 and Q4. As the control voltage VCON is reduced, the proportion of current supplied to the differential pairs 18 and 20 by the transistors Q6 and Q7 is reduced, thereby reducing the transconductance of the differential pair Q6, Q7.

A common mode feedback stage 28 includes PNP transistors Q11 and Q12 with their emitters connected to the shorted bases of transistors Q9 and Q10 and their collectors connected to a negative supply voltage V−. The bases of transistors Q11 and Q12 are connected to the bases of transistors Q3 and Q4, and to current sources I3 and I4, respectively. NPN transistors Q13 and Q14 are both connected at their collectors to the bias voltage terminal, BIAS and their emitters are connected to the bases of transistors Q11 and Q12, respectively. Variations in the output voltage, available at bases of transistors Q11 and Q12, are fed back through the transistors Q11 and Q12 to the bases of the load transistors Q9 and Q10. The complete left/right symmetry of the design ensures no systematic control feedthrough error and errors due to mismatches of the Q13 and Q14 base currents are minimized by keeping their emitter currents I3 and I4 small.

In the illustrated filter, a capacitor C2 is placed across high impedance nodes A and B formed at the junctions of the collectors of transistors Q9 and Q6 and Q7 and Q10 respectively. The cutoff frequency of this low pass filter is given by the expression:

$$Fo=[1/(2\pi C(R+(qI1/2kT)))][(1/(1+\exp(-VCONq/kT))]$$

Where:
C=the capacitance of C2
R=(R3+R4)/2
q=electron charge
k=Boltzmann's constant
T=temperature Kelvin The control voltage VCON is thus variable (theoretically) from zero to $1/(2\pi C(R+(qI1/2kT)))$. A high pass filter may be implemented by substituting an inductor L1 in the place of the capacitor C1 as the reactive element 40.

The forgoing description of specific embodiments of the invention has been presented for the purposes of illustration and description. It is not intended to be exhaustive or to limit the invention to the precise forms disclosed, and many modifications and variations are possible in light of the above teachings. For example, PNP and NPN transistors could be substituted for one another, with appropriate adjustment of circuit polarities. Other voltage controlled filters: high pass and bandpass, may employ the new OTA. The embodiments were chosen and described in order to best explain the principles of the invention and its practical application, to thereby enable others skilled in the art to best utilize the invention. It is intended that the scope of the invention be limited only by the claims appended hereto.

We claim:

1. An operational transconductance amplifier comprising:
   first and second current sources,
   an active load circuit having control terminals,
   a bias voltage terminal,
   a first resistively degenerated matched pair of bipolar transistors, each having two current conducting terminals and a control terminal, the control terminals of which form a differential amplifier input port, the respective first current conducting terminals of said pair coupled through equal valued resistors to said first current source and the respective second current conducting terminals of which are coupled through said active load circuit to a bias voltage terminal,
   a second resistively degenerated matched pair of bipolar transistors, each having two current conducting terminals and a control terminal, the control terminals of which form a differential amplifier output port, the respective first current conducting terminals of said second pair coupled through equal valued resistors to said second current source and the respective second current conducting terminals of which are connected to the respective second current conducting terminals of said first resistively degenerated matched pair of bipolar transistors, and
   a common mode feedback circuit connected between said differential output port and said active load control terminals to provide feedback control of said active load.

2. The amplifier of claim 1, further comprising:
   a current steering circuit having a voltage control input, said current steering circuit connected between said active load circuit and said differential pairs to steer, under control of said voltage control input, a portion of the current supplied to said second current conducting terminals of said first and second differential pairs through said active load.

3. The amplifier of claim 2, further comprising:
   a diode noise reduction circuit connected between said bias voltage terminal and said active loads.

4. An operational transconductance amplifier comprising:
   first and second current sources,
   an active load circuit having control terminals,
   a bias voltage terminal,
   a first matched pair of bipolar transistors, the bases of which form a differential amplifier input, the emitters of which are coupled through equal-valued resistors to said first current source and the collectors of which are coupled through said active load circuit to said bias voltage terminal,
   a second matched pair of bipolar transistors, the bases of which form a differential amplifier output, the emitters of which are coupled through equal-valued resistors to said second current source and the collectors of which are connected, one each, to the collectors of said first matched pair of bipolar transistors, and
   a common mode feedback circuit connected between said differential amplifier output and said active load control terminals.

5. The amplifier of claim 4, further comprising:
   a current steering circuit having a voltage control input, said current steering circuit connected between said active load and said differential pairs to steer, under control of said voltage control input, a portion of the current supplied to said collectors of said first and second differential pairs through said active load.

6. The amplifier of claim 5, further comprising:
   a diode noise reduction circuit connected between said bias voltage terminal and said active loads.

7. A voltage controlled filter, comprising:
   an operational transconductance amplifier comprising:
      first and second current sources,
      an active load circuit having control terminals,
      a bias voltage terminal,
      a first matched pair of bipolar transistors, the bases of which form a differential amplifier input, the emitters of which are coupled through equal-valued resistors to said first current source and the collectors of which are coupled through said active load circuit to said bias voltage terminal,
      a second matched pair of bipolar transistors, the bases of which form a differential amplifier output, the emitters of which are coupled through equal-valued resistors to said second current source and the collectors of which are connected, one each, to the collectors of said first matched pair of bipolar transistors, a common mode feedback circuit connected between said differential amplifier output and said active load control terminals, a current steering circuit having a voltage control input, said current steering circuit connected between said active load and said differential pairs to steer, under control of said voltage control input, a portion of the current supplied to said collectors of said first and second differential pairs through said active load, and a reactive circuit element connected between high impedance nodes of said amplifier formed at the junctions of said current steering circuit and said active load circuit.

8. The filter of claim 7 wherein, said amplifier further comprises:

a diode noise reduction circuit connected between said bias voltage terminal and said active loads.

9. The filter of claim 7 wherein, said filter is a low pass filter formed when said reactive element comprises a capacitor.

10. The filter of claim 7 wherein, said filter is a high pass filter formed when said reactive element comprises an inductor.

* * * * *